(12) United States Patent
Wu

(10) Patent No.: US 10,333,531 B2
(45) Date of Patent: Jun. 25, 2019

(54) SYNCHRONOUS OSCILLATION CIRCUIT

(71) Applicant: National Chung Cheng University, Chiayi County (TW)

(72) Inventor: Janne Wha Wu, Chiayi (TW)

(73) Assignee: NATIONAL CHUNG CHENG UNIVERSITY, Chiayi County (TW)

( * ) Notice: Subject to any disclaimer, the term of this patent is extended or adjusted under 35 U.S.C. 154(b) by 205 days.

(21) Appl. No.: 15/439,977

(22) Filed: Feb. 23, 2017

(65) Prior Publication Data

US 2018/0241346 A1  Aug. 23, 2018

(51) Int. Cl.
| | |
|---|---|
| *G06F 1/12* | (2006.01) |
| *H03L 7/24* | (2006.01) |
| *H03B 27/00* | (2006.01) |
| *H03L 7/099* | (2006.01) |
| *H03B 5/12* | (2006.01) |
| *H03B 5/36* | (2006.01) |
| *H03K 3/03* | (2006.01) |

(52) U.S. Cl.
CPC ............... *H03L 7/099* (2013.01); *G06F 1/12* (2013.01); *H03B 5/1203* (2013.01); *H03B 5/362* (2013.01); *H03B 27/00* (2013.01); *H03K 3/0315* (2013.01); *H03L 7/24* (2013.01); *H03B 2200/001* (2013.01); *H03B 2200/0008* (2013.01); *H03B 2200/0074* (2013.01)

(58) Field of Classification Search
CPC .......... H03L 7/24; G06F 1/12; H03B 5/1203; H03B 5/1284; H03B 5/362; H03B 27/00; H03B 2200/0074; H03K 3/0315
See application file for complete search history.

(56) References Cited

U.S. PATENT DOCUMENTS

| | | | | |
|---|---|---|---|---|
| 6,911,870 B2* | 6/2005 | Gierkink | ................ | H03B 27/00 331/117 FE |
| 8,264,288 B2* | 9/2012 | Lin | ...................... | H03B 5/1228 331/107 SL |
| 9,520,356 B1* | 12/2016 | Chiesa | ................ | H01L 23/5226 |
| 2007/0063779 A1* | 3/2007 | Kanda | ....................... | G06F 1/04 331/167 |
| 2008/0143446 A1* | 6/2008 | Yao | ........................ | H03B 27/00 331/45 |
| 2010/0207695 A1* | 8/2010 | Bao | ...................... | H03B 5/1218 331/117 FE |

* cited by examiner

*Primary Examiner* — Ryan Johnson
(74) *Attorney, Agent, or Firm* — Bacon & Thomas, PLLC

(57) ABSTRACT

A synchronous oscillation circuit has multiple oscillators, a grounding unit and a common floating grounding unit. Each of the oscillators has a ground terminal. The grounding unit has a first terminal and a second terminal, wherein the second terminal is grounded. The common floating grounding unit is electrically connected between the ground terminals of the oscillators and the first terminal of the grounding unit. The oscillators are grounded through the common floating grounding unit and the grounding unit, so that the oscillators interfere with each other. When the oscillation signals generated by the oscillators reach a steady state, the oscillation frequencies of the oscillators are synchronized.

3 Claims, 11 Drawing Sheets

SYNCHRONOUS OSCILLATION CIRCUIT

BACKGROUND OF THE INVENTION

1. Field of the Invention

The present invention relates to a synchronous oscillation circuit, especially a synchronous oscillation circuit synchronizing the oscillation signals generated by multiple oscillators.

2. Description of the Prior Arts

A synchronous oscillation circuit has multiple oscillators for generating oscillating signals. An injection locking technique is generally used to synchronize the oscillating signals generated by the multiple oscillators.

However, the injection locking technique may possibly cause transmission delay for oscillation signals. Such delay problem may not be obvious for oscillation signals. However, for extremely high frequency oscillation signals, i.e. the oscillating frequency is approximately 30-300 GHz, it would be difficult to synchronize the oscillation signals by the injection locking technique.

SUMMARY OF THE INVENTION

The purpose of the present invention is to provide a synchronous oscillation circuit without using the injection locking technique. The synchronous oscillation circuit comprises:

multiple oscillators, each one of the oscillators having a ground terminal;

a grounding unit having a first terminal and a second terminal, wherein the second terminal is grounded; and a common floating grounding unit electrically connected between the ground terminals of the oscillators and the first terminal of the grounding unit.

According to the present invention, the ground terminals of the oscillators are connected with each other through the common floating grounding unit, so that the oscillators interfere with each other. When the oscillation signals generated by the oscillators reach a steady state, the oscillation frequencies of the oscillators will be synchronized. Compared with the prior art, the oscillation signals can still be successfully synchronized even when wavelengths of the oscillation signals are up to millimeters.

DETAILED DESCRIPTION OF THE INVENTION

Figure 1:
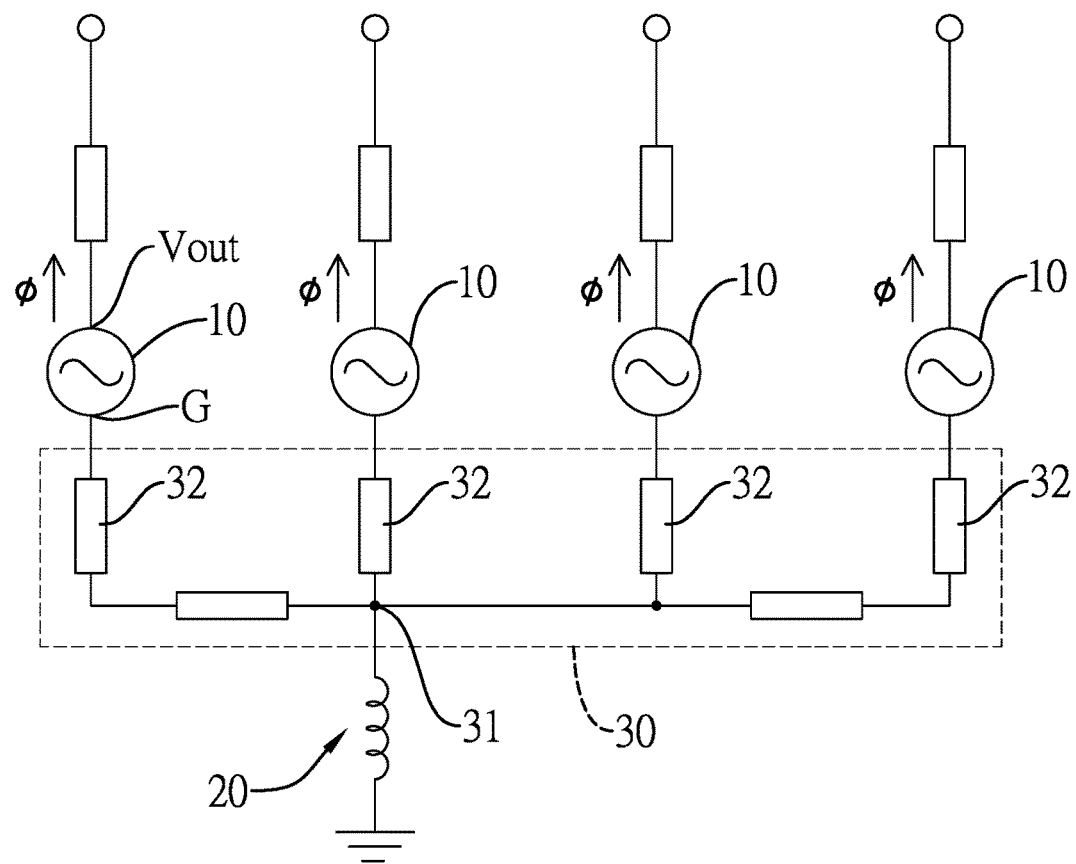
FIG. 1 is a block circuit diagram of the first preferred embodiment of a synchronous oscillation circuit of the present invention.

As shown in FIG. 1, a synchronous oscillation circuit comprises multiple oscillators 10, a grounding unit 20 and a common floating grounding unit 30. Please note that the embodiment with four oscillators 10 as shown in FIG. 1 is just taken as an example, not limiting the present invention. Each oscillator 10 has a signal output terminal Vout and a ground terminal G. The signal output terminal Vout outputs an oscillation signal Φ. The grounding unit 20 has a first terminal and a second terminal, wherein the second terminal is grounded. The common floating grounding unit 30 is electrically connected between the ground terminals G of the oscillators 10 and the first terminal of the grounding unit 20, which means that rather than grounding directly, the ground terminals G of the oscillators 10 are grounded via the common floating grounding unit 30 and the grounding unit 20.

As shown in FIG. 1, the common floating grounding unit 30 comprises a common node 31 and multiple electronic components 32. The common node 31 is a floating common-ground node. The ground terminals G of the oscillators 10 are electrically connected to the common node 31 via the electronic components 32 respectively. The electronic component 32 may be a transmission line, a wire or an RLC circuit composed of a resistor, an inductor and a capacitor. Moreover, the first terminal of the grounding unit 20 is electrically connected to the common node 31 of the common floating grounding unit 30. The grounding unit 20 may be an inductor, an RLC circuit, a transmission line or a wire. Please note that the inductor as shown in FIG. 1 is just taken as an example to illustrate the grounding unit 20, and the grounding unit 20 is not limited to the inductor.

Figure 2:
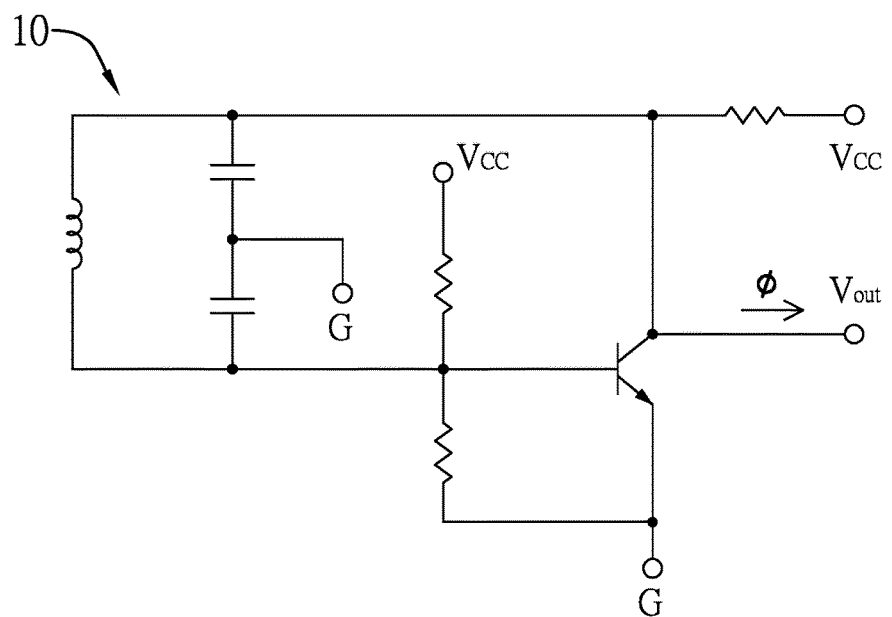
FIG. 2 is a circuit diagram of the first preferred embodiment of an oscillator of the synchronous oscillation circuit as shown in FIG. 1.
Figure 3:
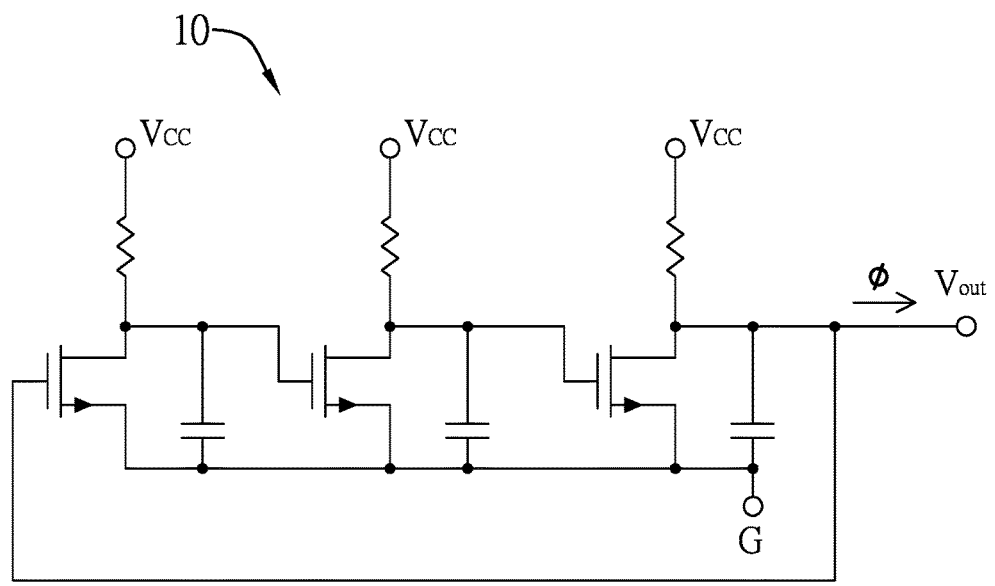
FIG. 3 is a circuit diagram of the second preferred embodiment of an oscillator of the synchronous oscillation circuit as shown in FIG. 1.
Figure 4:
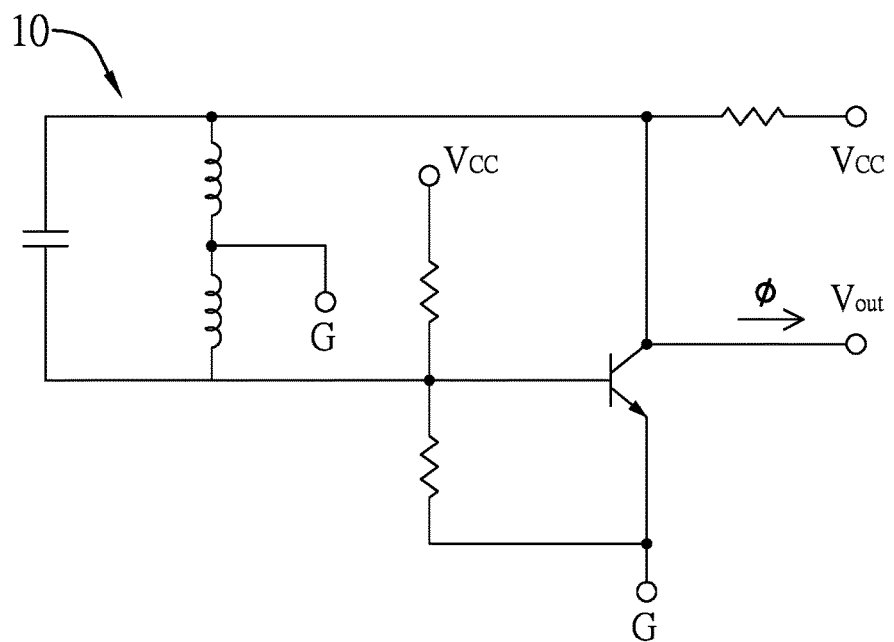
FIG. 4 is a circuit diagram of the third preferred embodiment of an oscillator of the synchronous oscillation circuit as shown in FIG. 1.
Figure 5:
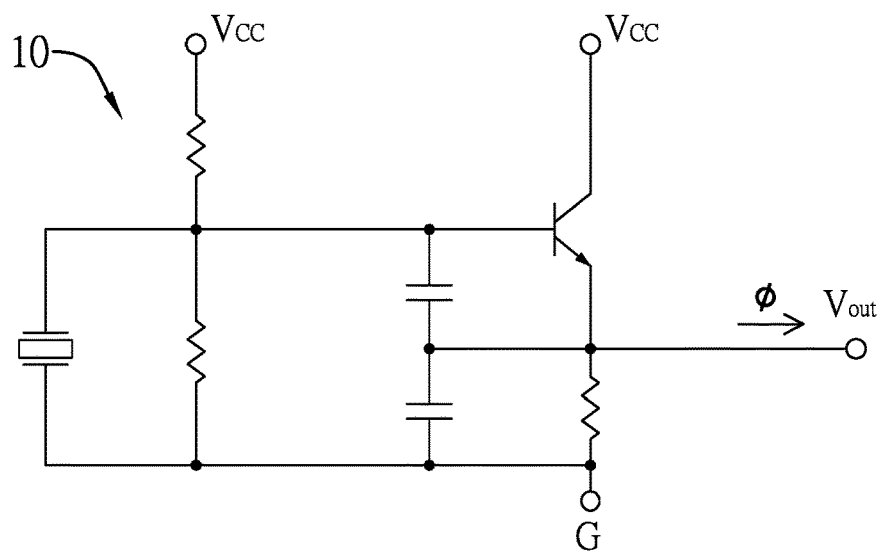
FIG. 5 is a circuit diagram of the fourth preferred embodiment of an oscillator of the synchronous oscillation circuit as shown in FIG. 1.

For instance, the oscillator 10 may be, but not limited to, an LC resonant cavity oscillator, a Voltage-Controlled Oscillator (VCO), a Colpitts oscillator, a Ring oscillator, a Hartley oscillator or a transistor-based oscillator. FIG. 2 is a typical circuit of the Colpitts oscillator. The ground terminal G of the Colpitts oscillator is electrically connected to the common node 31 via the electronic component 32 of the common floating grounding unit 30. FIG. 3 is a typical circuit of the Ring oscillator. The ground terminal G of the Ring oscillator is electrically connected to the common node 31 via the electronic component 32 of the common floating grounding unit 30. FIG. 4 is a typical circuit of the Hartley oscillator. The ground terminal G of the Hartley oscillator is electrically connected to the common node 31 via the electronic component 32 of the common floating grounding unit 30. FIG. 5 is a typical circuit of the transistor-based oscillator. The ground terminal G of the transistor-based oscillator is electrically connected to the common node 31 via the electronic component 32 of the common floating grounding unit 30.

Although the oscillators 10 are operated independently, the ground terminals G of the oscillators 10 are all connected together by the common floating grounding unit 30. Hence, the oscillators 10 interfere with each other. When the oscillation signals generated by the oscillators 10 reach the steady state, the oscillation frequency and phase of the oscillation signals will be synchronized.

Figure 6:
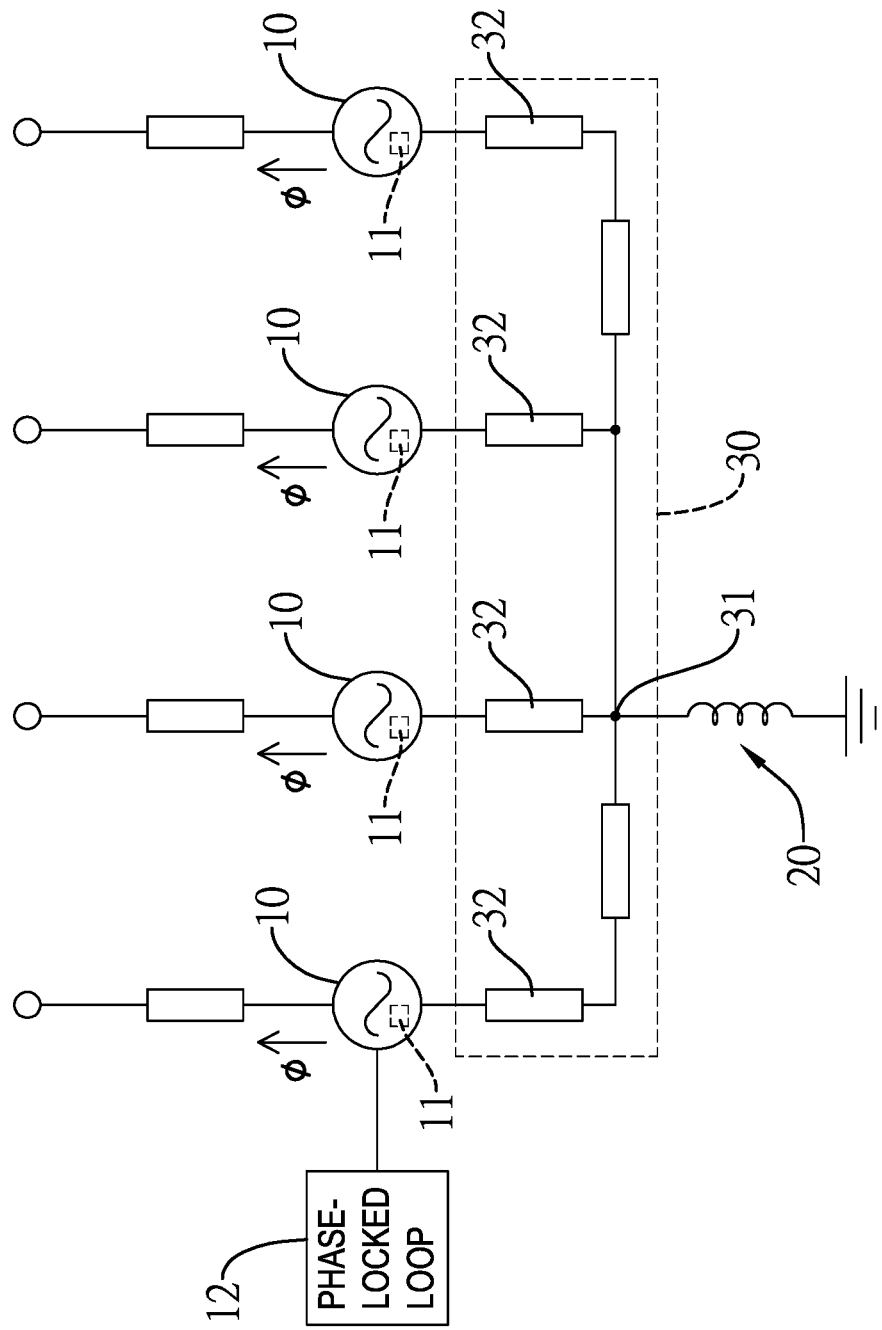
FIG. 6 is a block circuit diagram of the second preferred embodiment of the synchronous oscillation circuit.

In another embodiment, the phase of the oscillation signal $\psi$ are adjustable, such that there are phase differences among different oscillation signals $\Phi$ generated by different oscillators 10. As shown in FIG. 6, each oscillator comprises a phase modulation circuit 11 that modulates the phase of the oscillation signal $\Phi$ generated by this oscillator 10. Therefore, the phase modulation circuit 11 is integrated into the oscillator 10 instead of an external phase-shift circuit to achieve the advantages of simplified circuit, saving space and reducing cost. Moreover, any one of the oscillators 10 can be electrically connected to a phase-locked loop (PLL) 12, adapted as a master oscillator to obtain a stable frequency output.

Figure 7:
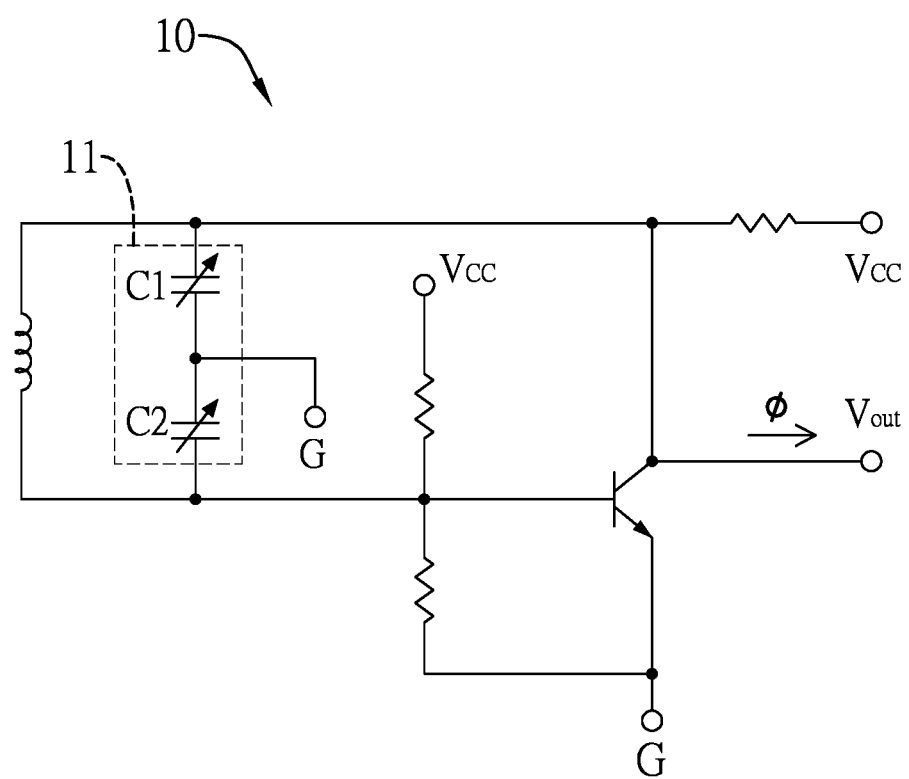
FIG. 7 is a circuit diagram of the first preferred embodiment of an oscillator of the synchronous oscillation circuit as shown in FIG. 6.

Taking the typical cruciate Colpitts oscillator as shown in FIG. 7 as an example, the Colpitts oscillator comprises a first capacitor C1 and a second capacitor C2. One terminal of the first capacitor C1 and one terminal of the second capacitor C2 are electrically connected to the common node 31 via the electronic component 32 of the common floating grounding unit 30. The first capacitor C1 and the second capacitor C2 are variable capacitors and form the phase modulation circuit 11. Therefore, the phase of the oscillation signal $\psi$ can be modulated by adjusting the capacitance of the first capacitor C1 and the second capacitor C2.

Figure 8:
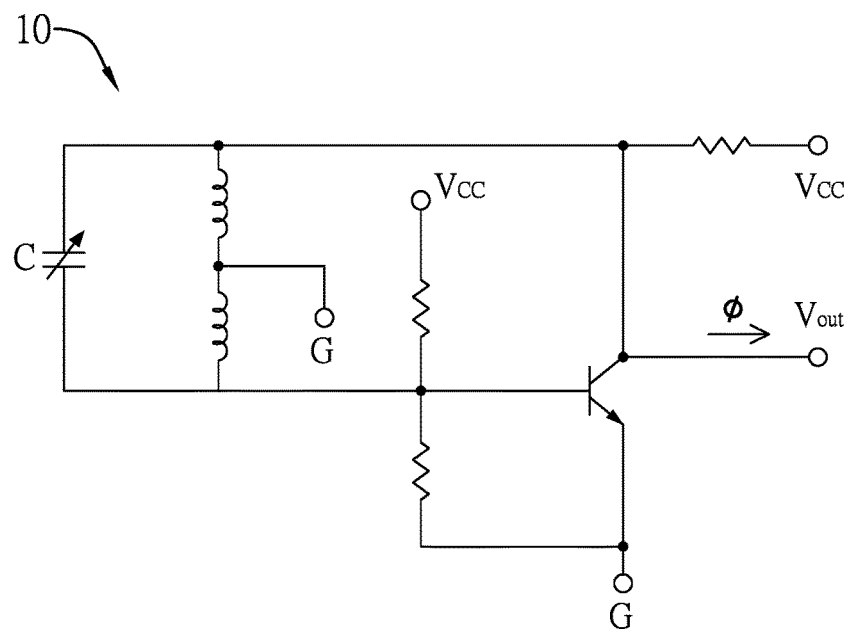
FIG. 8 is a circuit diagram of the second preferred embodiment of an oscillator of the synchronous oscillation circuit as shown in FIG. 6.

Taking the typical cruciate Hartley oscillator as shown in FIG. 8 as another example, the Hartley oscillator comprises a capacitor C. The capacitor C is a variable capacitor and functions as the phase modulation circuit 11. The phase of the oscillation signal $\Phi$ can be modulated by adjusting the capacitance of the capacitor C.

Figure 9:
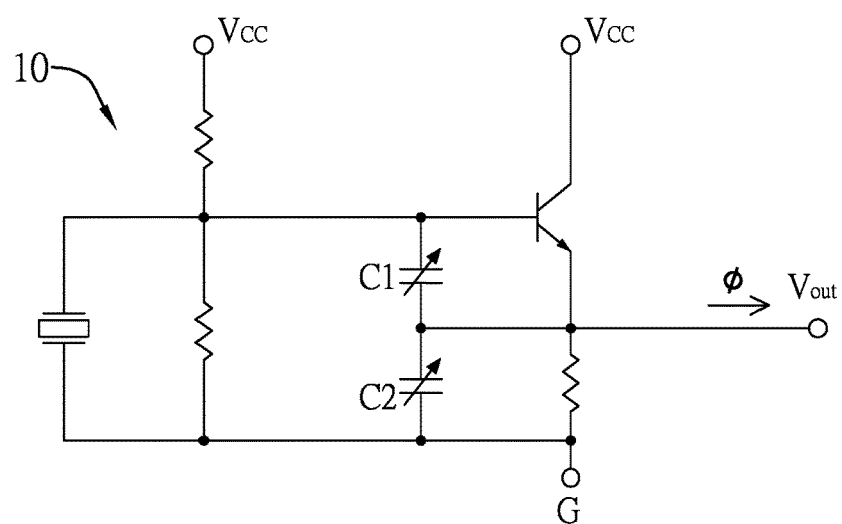
FIG. 9 is a circuit diagram of the third preferred embodiment of an oscillator of the synchronous oscillation circuit as shown in FIG. 6.

Taking the typical cruciate transistor-based oscillator as shown in FIG. 9 as another example, the transistor-based oscillator comprises a first capacitor C1 and a second capacitor C2. The common node of the first capacitor C1 and the second capacitor C2 is electrically connected to the signal output terminal Vout of the oscillator. The first capacitor C1 and the second capacitor C2 are variable capacitors and form the phase modulation circuit 11. The phase of the oscillation signal $\Phi$ can be modulated by adjusting the capacitance of the first capacitor C1 and the second capacitor C2.

Figure 10:
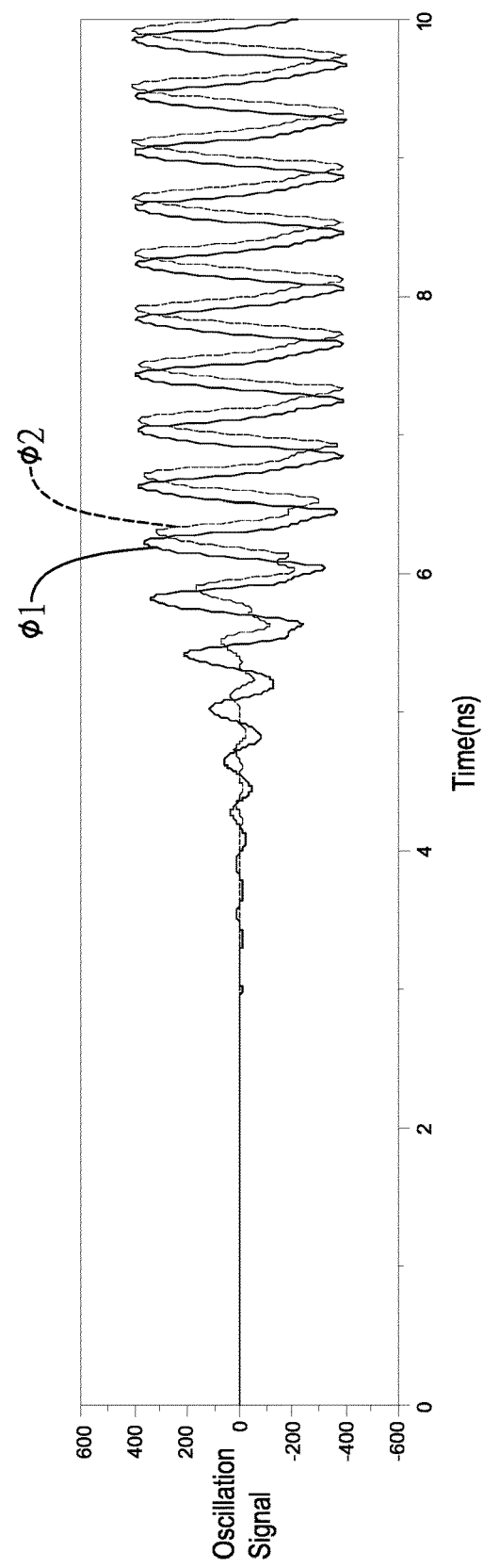
FIG. 10 is a signal oscillogram of the oscillation signals generated by two oscillators of an embodiment of the present invention from 0 ns (nanosecond) to 10 ns.
Figure 11:
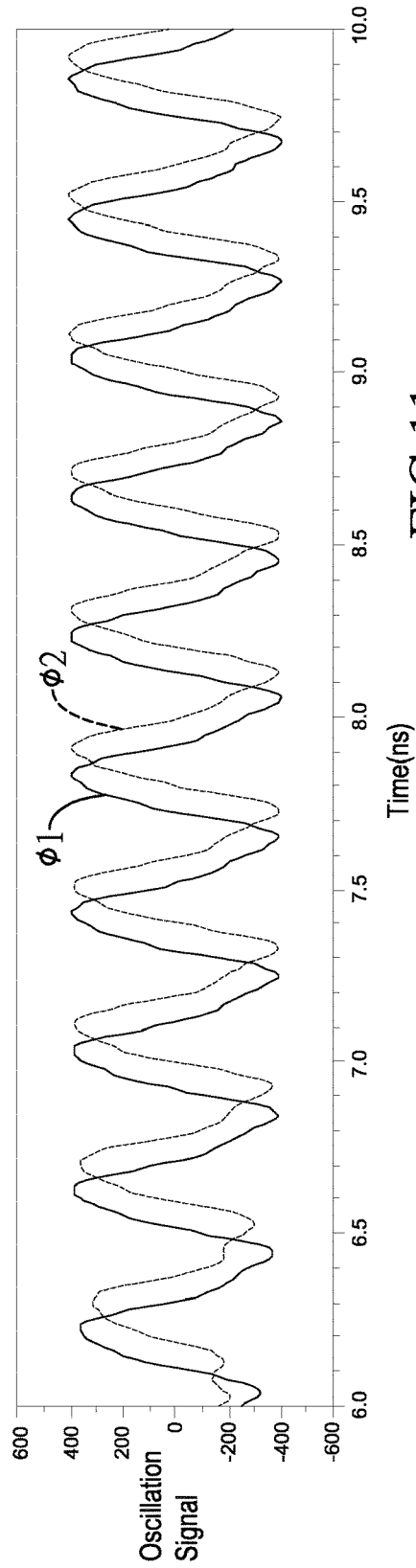
FIG. 11 is a signal oscillogram of the oscillation signals generated by two oscillators of an embodiment of the present invention from 6 ns to 10 ns of as shown in FIG. 10.
Figure 12:
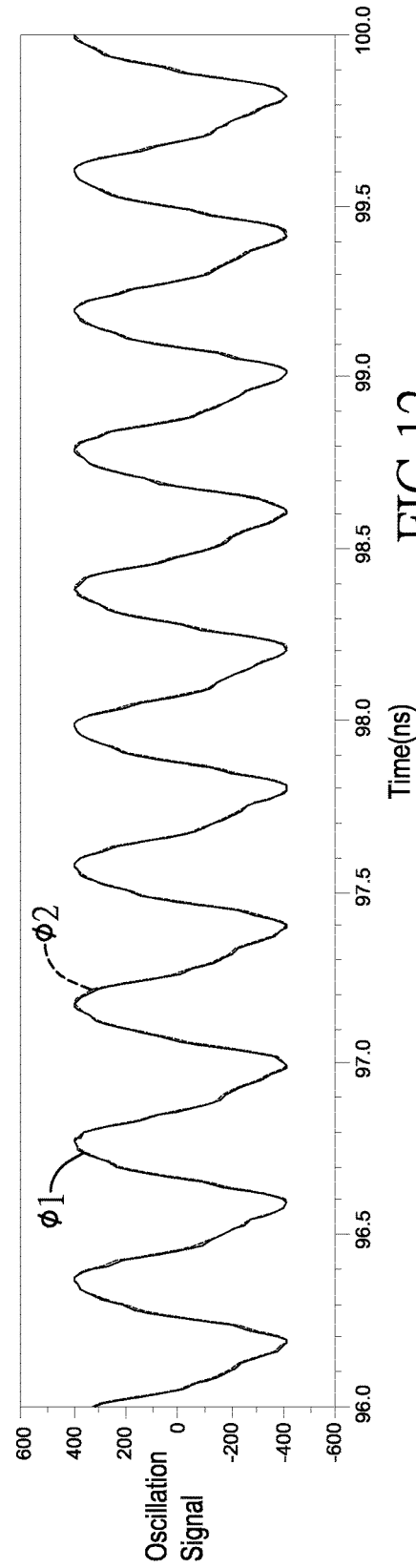
FIG. 12 is a signal oscillogram of the oscillation signals generated by two oscillators of an embodiment of the present invention from 96 ns to 100 ns.

The modulation of the phases of the oscillation signals will be illustrated by the following signal oscillograms. Taking the oscillation signals generated by two oscillators as an example, as shown in FIG. 10 and FIG. 11, one oscillator generates a first oscillation signal $\Phi 1$, and the other oscillator generates a second oscillation signal $\Phi 2$. The initial values of the natural frequency of the first oscillation signal $\Phi 1$ and the second oscillation signal $\Phi 2$ are the same, e.g. the initial value is 2.5 GHz. The phase of the second oscillation signal $\Phi 2$ lags behind the phase of the first oscillation signal $\Phi 1$. By modulating the modulation circuit 11 of either or both of the two oscillators, as shown in FIG. 12, the phases of the first oscillation signal $\Phi 1$ and the second oscillation signal $\Phi 2$ can be the same in the steady state.

Figure 13:
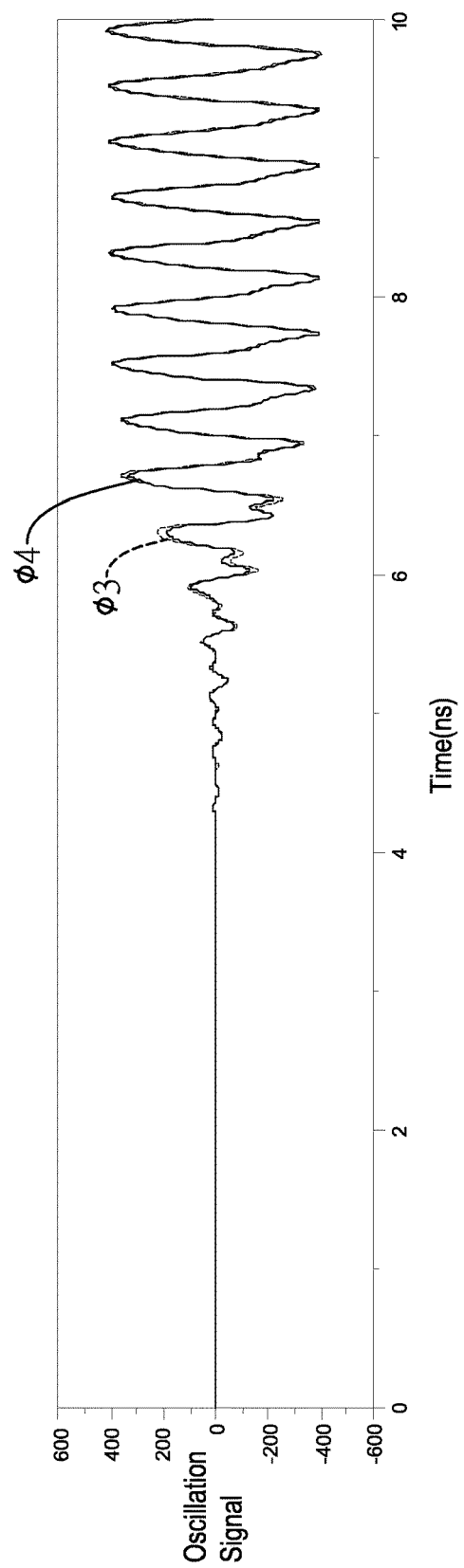
FIG. 13 is a signal oscillogram of the oscillation signals generated by two oscillators of another embodiment of the present invention from 0 ns (nanosecond) to 10 ns.
Figure 14:
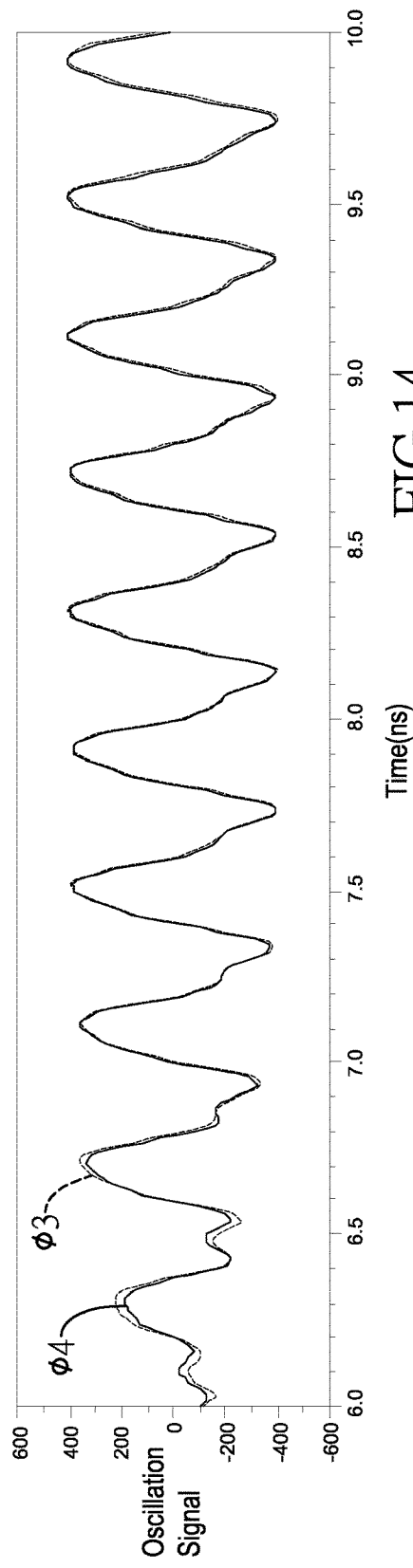
FIG. 14 is a signal oscillogram of the oscillation signals generated by two oscillators of said another embodiment of the present invention from 6 ns to 10 ns of as shown in FIG. 13.
Figure 15:
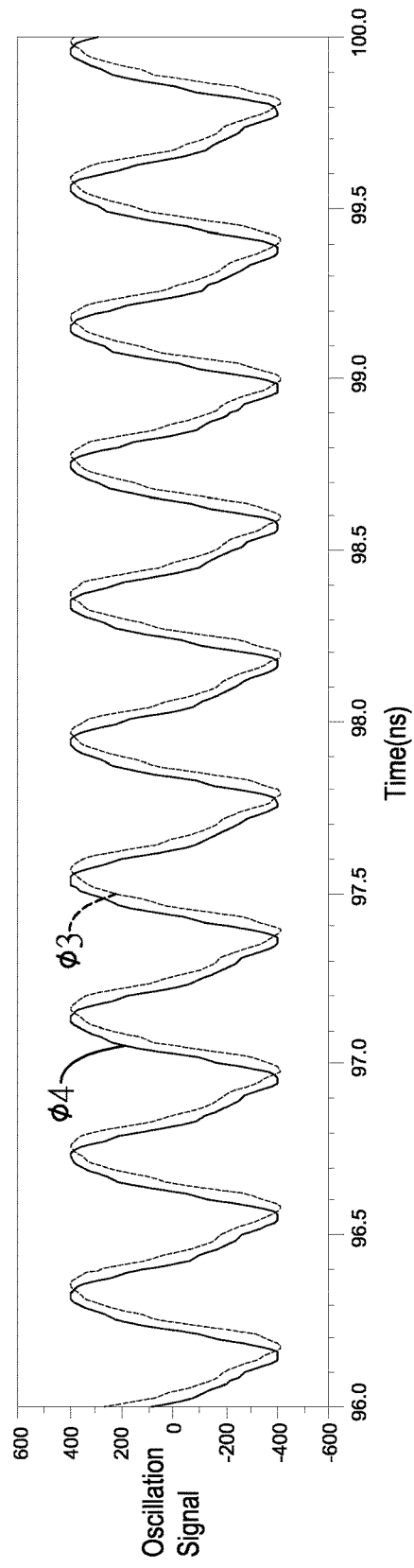
FIG. 15 is a signal oscillogram of the oscillation signals generated by two oscillators of said another embodiment of the present invention from 96 ns to 100 ns.

Taking the oscillation signals generated by two oscillators as another example, as shown in FIG. 13 and FIG. 14, one oscillator generates a third oscillation signal $\Phi 3$, and the other oscillator generates a fourth oscillation signal $\Phi 4$. The initial value of the natural frequency of the third oscillation signal $\Phi 3$ is different from the fourth oscillation signal $\Phi 4$, e.g. the initial value of the third oscillation signal $\Phi 3$ is 2.5 GHz while the initial value of the fourth oscillation signal $\Phi 4$ is 2.497 GHz. The phases of the third oscillation signal $\Phi 3$ and the fourth oscillation signal $\Phi 4$ are the same. Because the two oscillators interfere with each other, the free oscillation frequency can be synchronized by 2.498 GHz in the steady state as shown in FIG. 15. Besides, by modulating the modulation circuit of either or both of the two oscillators, the phase of the third oscillation signal $\Phi 3$ can lag behind the fourth oscillation signal $\Phi 4$.

Figure 16:
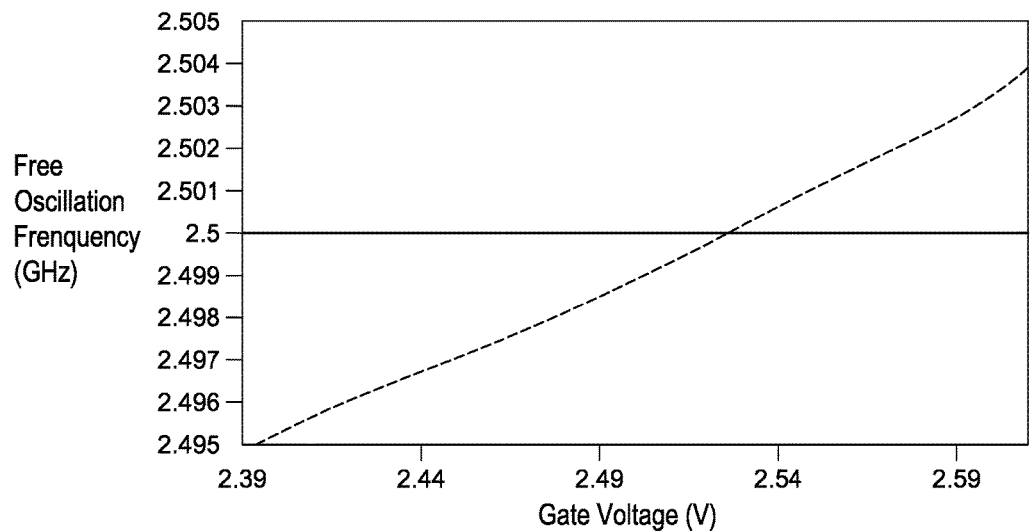
FIG. 16 shows characteristic curves of the grid voltage and the free oscillation frequency of the voltage-controlled oscillator of the present invention.

The typical Voltage-Controlled Oscillator (VCO) comprises a voltage controlled transistor. The free oscillation frequency of the Voltage-Controlled Oscillator can be modulated by adjusting a gate voltage of the voltage controlled transistor. As shown in FIG. 16, taking a first Voltage-Controlled Oscillator and a second Voltage-Controlled Oscillator as an example, the free oscillation frequency of the oscillation signal, shown by the solid line, generated by the first Voltage-Controlled Oscillator remains at 2.5 GHz. The free oscillation frequency of the oscillation signal, shown by broken lines, generated by the second Voltage-Controlled Oscillator can be modulated by adjusting the gate voltage of the voltage controlled transistor of the second Voltage-Controlled Oscillator. As shown in FIG. 16, the gate voltage of the voltage controlled transistor of the second Voltage-Controlled Oscillator is proportional to the free oscillation frequency of the oscillation signal generated by the second Voltage-Controlled Oscillator.

Figure 17:
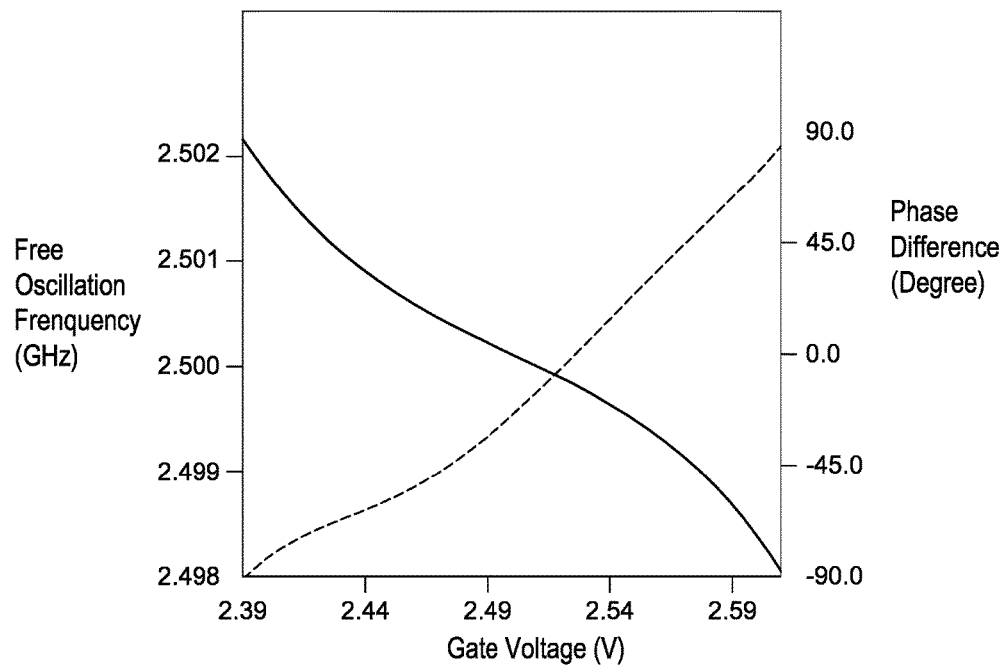
FIG. 17 shows characteristic curves of the grid voltage, the phase difference and the free oscillation frequency of the voltage-controlled oscillator of the present invention.

Besides, as shown in FIG. 17, under the circumstances that the free oscillation frequency of the oscillation signal generated by the first Voltage-Controlled Oscillator is 2.5 GHz and the gate voltage of the voltage controlled transistor of the second Voltage-Controlled Oscillator is proportional to the free oscillation frequency, shown by the broken lines, of the oscillation signal generated by the second Voltage-Controlled Oscillator, there can be a phase difference, shown by the solid line, between the oscillation signals generated by the first Voltage-Controlled Oscillator and the second Voltage-Controlled Oscillator. As the gate voltage of the voltage controlled transistor of the second Voltage-Controlled Oscillator increases, the phase difference is changed from a positive value to a negative value. Therefore, by adjusting the gate voltage of the voltage controlled transistor, an oscillation signal with desirable phase or free oscillation frequency can be generated by the Voltage-Controlled Oscillator.

What is claimed is:

1. A synchronous oscillation circuit comprises:
    multiple oscillators operated independently and outputting multiple oscillating signals respectively, each one of the oscillators having:
    a ground terminal; and
    a phase modulation circuit adjusting a phase of the oscillating signal outputted by the oscillator;
    a grounding unit having a first terminal and a second terminal, wherein the second terminal is grounded;
    a common floating grounding unit electrically connected between the ground terminals of the oscillators and the first terminal of the grounding unit, and having:
    multiple transmission lines; and
    a common node connected to the first terminal of the grounding unit, wherein the ground terminals of the oscillators are electrically connected to the common node through the respective transmission lines for the multiple oscillators to interfere with each other;
    wherein when the multiple oscillators interfere with each other to reach a steady state, free oscillating frequencies of the respective oscillating signals outputted by the multiple oscillators are synchronized to be equal.

2. The synchronous oscillation circuit as claimed in claim 1, wherein one of the oscillators is electrically connected to a phase-locked loop.

3. The synchronous oscillation circuit as claimed in claim 1, wherein the phase modulation circuit is composed of variable capacitors.

* * * * *